(12) United States Patent
Chuang

(10) Patent No.: US 6,362,081 B1
(45) Date of Patent: Mar. 26, 2002

(54) METHOD TO IMPROVE RESISTANCE UNIFORMITY AND REPEATABILITY FOR LOW ENERGY ION IMPLANTATION

(75) Inventor: Yueh-cheng Chuang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/611,888

(22) Filed: Jul. 7, 2000

(30) Foreign Application Priority Data

Jan. 20, 2000 (TW) ........................................ 89100920 A

(51) Int. Cl.[7] .......................................... H01L 21/425
(52) U.S. Cl. ........................................ 438/522; 438/514
(58) Field of Search ................................ 438/365, 369, 438/530, 514, 522

(56) References Cited

U.S. PATENT DOCUMENTS 5,362,685 A * 11/1994 Gardner et al. ............. 437/238
5,846,869 A * 12/1998 Hashimoto et al. ......... 438/365

* cited by examiner

Primary Examiner—Richard Elms
Assistant Examiner—Bradley Smith
(74) Attorney, Agent, or Firm—Klein & Szekeres, LLP

(57) ABSTRACT

A method of improving the resistance (Rs) uniformity and repeatability of a wafer having a silicon layer thereon is provided. The silicon layer is treated with a low energy ion implantation process. The method includes the steps of cleaning a surface portion of the silicon layer to remove a native oxide layer from the surface portion of the silicon layer by using a dilute hydrofluoric acid (HF) solution; cleaning the surface portion of the silicon layer to remove a contaminant from the surface portion of the silicon layer by using a dilute hydrochloric acid (HCl); immersing the wafer into an ozone solution to form a chemical oxide layer on the silicon layer; annealing the silicon layer by a spike annealing rapid thermal process (RTP) for recovering the damaged silicon crystal structure of the silicon layer resulted from the low energy ion implantation process.

11 Claims, 1 Drawing Sheet

METHOD TO IMPROVE RESISTANCE UNIFORMITY AND REPEATABILITY FOR LOW ENERGY ION IMPLANTATION

FIELD OF THE INVENTION

The present invention is related to a method of improving the resistance (Rs) uniformity and repeatability for low energy ion implantation, and particularly to a method of improving the resistance (Rs) uniformity and repeatability for low energy ion implantation applied in a semiconductor-manufacturing process.

BACKGROUND OF THE INVENTION

With progress of the technology, it's well known that the semiconductor industry has stepped from the anterior sub-micron era into the present sub-half-micron era. Besides, there is a tendency to further miniaturize the size of semiconductor devices as well. To achieve the tendency of scaling-down semiconductor devices, it's important to improve the manufacturing process of the semiconductor devices. For instance, the cooperation of the low energy ion implantation with the spike annealing rapid thermal process (RTP) is developed for meeting such a requirement of manufacturing further miniaturized semiconductor devices in the future.

More specifically, the low energy ion implantation is directed to implant ions with +3 or +5 valence electrons into a silicon layer. Thereafter, the damaged silicon crystal structure of the silicon layer resulted from low energy ion implantation is then recovered by the spike annealing rapid thermal process (RTP). However, resistance (Rs) uniformity and repeatability of such a cooperation are very bad conventionally. Besides, the longer the time of the rapid thermal process is, the more serious the problem of the implanted ions which diffuse outward is.

As mentioned above, according to the prior art, there are some drawbacks existing as follows.
1. There are the problems of bad resistance (Rs) uniformity and repeatability existed in such a cooperation of the low energy ion implantation applied in semiconductor diffusion process with the spike annealing rapid thermal process (RTP).
2. Because of gradual decrease of the resistance (Rs) measurement, the yield of the semiconductor devices is lowered.

SUMMARY OF THE INVENTION

An object of the present invention is to provide a method of cooperating of the low energy ion implantation applied in semiconductor diffusion process with the spike annealing rapid thermal process (RTP).

Another object of the present invention is to provide a method of improving the resistance uniformity and repeatability for the low energy ion implantation applied in semiconductor diffusion process.

A further object of the present invention is to provide a method of improving the yield of the semiconductor devices for the low energy ion implantation applied in semiconductor diffusion process.

According to the present invention, the method of improving a resistance uniformity and repeatability of a wafer having a silicon layer thereon after said silicon layer is treated with a low energy ion implantation process, comprising steps of cleaning and oxidizing a surface portion of said silicon layer; and annealing said silicon layer for recovering a damaged silicon crystal structure of said silicon layer resulted from said low energy ion implantation.

Preferably, the low energy ion implantation process is executed at a low energy less than 10 Kev, and the ion is an arsenic ion, The step of cleaning and oxidizing said surface portion of said silicon layer includes the steps of cleaning said surface portion of said silicon layer to remove a native oxide layer from said surface portion of said silicon layer by using a dilute hydrofluoric acid (HF) solution; cleaning said surface portion of said silicon layer to remove a contaminant from said surface portion of said silicon layer by using a dilute hydrochloric acid (HCl) solution; and immersing said wafer into an ozone solution to form a chemical oxide layer on said silicon layer.

The silicon layer is annealed by a spike annealing rapid thermal process (RTP).

The spike annealing rapid thermal process (RTP) is executed by rapidly heating said silicon layer to a specific temperature and then instantaneously lowering said specific temperature to a room temperature.

The specific temperature is 1100° C.

The present invention may best be understood through the following description with reference to the accompanying drawings, in which:

DETAILED DESCRIPTION OF THE PREFERRED EMBODIMENTS

Figure 1:
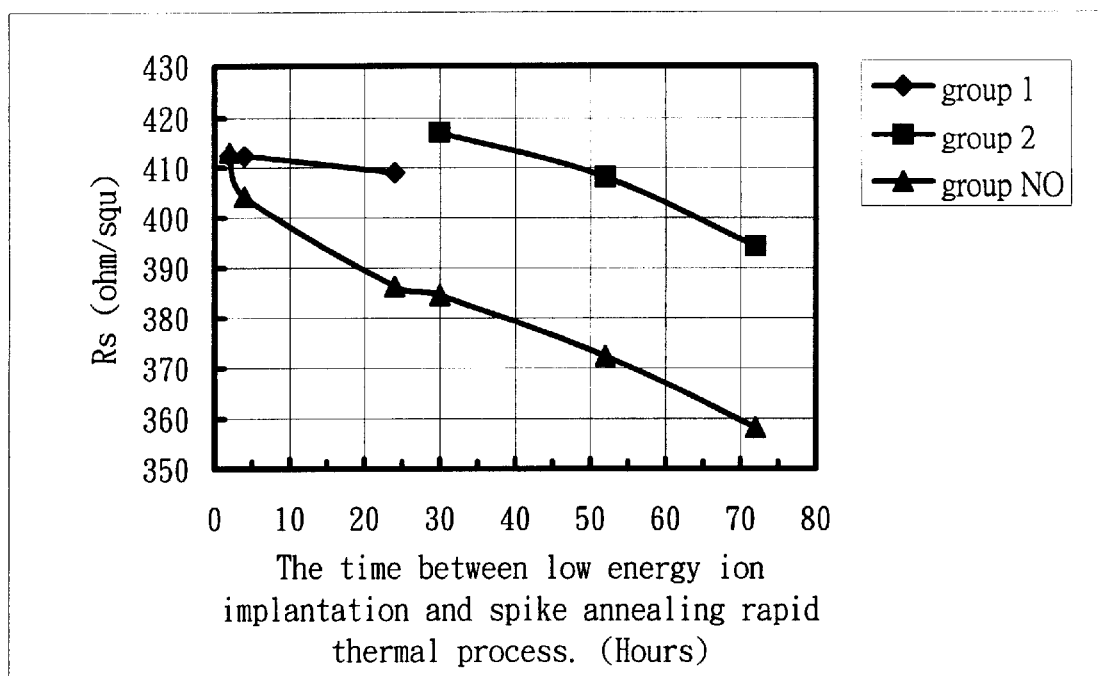
FIG. 1 is a trend chart showing the relationship between the resistance (Rs) measurement and the time between low energy ion implantation and spike annealing rapid thermal process.

The present invention is directed to a method of improving the resistance uniformity and repeatability for low energy arsenic ion implantation applied in a semiconductor diffusion process. More specifically, first of all, the arsenic ions are implanted into a silicon layer over a wafer by the way of low energy ion implantation, wherein the silicon layer has a naturally formed native oxide layer thereon. Thereafter, a surface portion of the silicon layer is cleaned to remove the native oxide layer by using a dilute hydrofluoric acid (HF) solution, and the surface portion of the silicon layer is further cleaned to remove a contaminant remained on the surface portion of the silicon layer by using a dilute hydrochloric acid (HCl) solution. Then, the wafer is immersed into an ozone solution to form a chemical oxide layer on the silicon layer. The steps of cleaning and oxidizing the wafer is used to stabilize the physical and chemical properties of the surface of the wafer. Finally, a spike annealing rapid thermal process (RTP) is executed to recover the damaged silicon crystal structure of the silicon layer resulted from low energy Arsenic ion implantation.

The present invention can be better understood by way of the following example which is representative of the preferred embodiments, but which is not to be considered as limiting the scope of the invention.

EXAMPLE 1

The process of the present invention is as follows.

Step 1: A wafer having a silicon layer thereon is provided, and the silicon layer has a naturally formed native oxide layer thereon.

Step 2: The arsenic ions are implanted into the silicon layer by way of low energy ion implantation (2 Kev, $1 \times 10^{15}$ Arsenic ions/cm$^2$).

Step 3: A surface portion of the silicon layer is cleaned to remove the native oxide layer by using a dilute hydrofluoric acid (HF) solution for 70 seconds (Water: 20 L/min, HF(49%): 0.083 L/min).

Step 4: The surface portion of the silicon layer is further cleaned to remove a contaminant remained on the surface portion of the silicon layer by using a dilute hydrochloric acid (HCl) solution for 180 seconds (Water: 20 L/min, HCl(36%): 0.29 L/min ).

Step 5: The wafer is immersed into an ozone solution (5 ppm) to form a chemical oxide layer on the silicon layer.

Step 6: The damaged silicon crystal structure of the silicon layer owing to low energy ion implantation is recovered by spike annealing rapid thermal process (RTP), which is executed by rapidly heating the silicon layer to 1100° C. and then instantaneously lowering the temperature to a room temperature.

Step 7: After 49 sites of the wafer are randomly chosen for detecting the resistances, the average value and the standard deviation (STD %) or uniformity of the resistance (Rs) measurements are calculated.

Please refer to Table 1, which is the experimental information got by executing the representative of the preferred embodiments, Example 1. Besides, FIG. 1 is a trend chart showing the relationship between the resistance (Rs) measurement and the time between low energy ion implantation and spike annealing rapid thermal process, which is got according to the experimental information of Table 1.

As shown in Table 1, it's apparent that a perfect standard deviation (STD %) or uniformity can be got by executing the step of spike annealing rapid thermal process, which is executed by rapidly heating the silicon layer to 1100° C. and then instantaneously lowering the temperature to a room temperature.

As shown in FIG. 1, the resistance (Rs) measurement is gradually lowered as time goes by. Particularly, this kind of problem is much more significant in the prior art (as shown in group NO of FIG. 1). However, according to the present invention, a more stable resistance (Rs) measurement can be got by proceeding the steps of cleaning and oxidizing the wafer after low energy ion implantation. In other words, the repeatability is maintained well in the semiconductor diffusion process. Accordingly, according to the present invention, the resistance (Rs) uniformity and repeatability is improved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

TABLE 1

| Wafer No. | The time between low energy ion implantation and spike annealing rapid thermal process. (Hours) | The time between low energy ion implantation and cleaning and oxidizing the wafer. (Hours) | Rs (Ohm/squ) | Uniformity (STD %) |
|---|---|---|---|---|
| 1 | 2 | 0 hour (FIG. 1: group 1) | 412.4 | 0.757 |
| 2 | 4 | 0 hour (FIG. 1: group 1) | 412.3 | 1.38 |
| 3 | 24 | 0 hour (FIG. 1: group 1) | 409.0 | 1.46 |
| 4 | 2 | No cleaning and oxidizing the wafer. (FIG. 1: group NO) | 413.0 | 0.659 |
| 5 | 4 | No cleaning and oxidizing the wafer. (FIG. 1: group NO) | 404.3 | 0.583 |
| 6 | 24 | No cleaning and oxidizing the wafer. (FIG. 1: group NO) | 386.3 | 0.564 |
| 7 | 30 | 24 hours (FIG. 1: group 2) | 417.1 | 0.855 |
| 8 | 52 | 24 hours (FIG. 1: group 2) | 408.2 | 0.873 |
| 9 | 72 | 24 hours (FIG. 1: group 2) | 394.4 | 0.597 |
| 10 | 30 | No cleaning and oxidizing the wafer. (FIG. 1: group NO) | 384.5 | 0.728 |
| 11 | 52 | No cleaning and oxidizing the wafer. (FIG. 1: group NO) | 372.4 | 0.731 |
| 12 | 72 | No cleaning and oxidizing the wafer. (FIG. 1: group NO) | 358.2 | 0.999 |

What is claimed is:

1. A method of improving a resistance uniformity and repeatability of a wafer having a silicon layer thereon, comprising the steps of:
    treating said silicon layer with a low energy ion implantation process;
    removing a native oxide layer and a contaminant from a surface portion of said silicon layer and oxidizing said surface portion thereof; and
    annealing said silicon layer for recovering a damaged silicon crystal structure of said silicon layer resulted from said low energy ion implantation.

2. The method according to claim 1, wherein said low energy ion implantation process is executed at an energy level less than 10 Kev.

3. The method according to claim 1, wherein said low energy ion implantation process is treated by an arsenic ion.

4. The method according to claim 1, wherein said step of removing said native oxide layer and said contaminant from said surface portion of said silicon layer and oxidizing said surface portion thereof includes the steps of:
    removing said native oxide layer from said surface portion of said silicon layer by using a dilute hydrofluoric acid (HF) solution;
    removing said contaminant from said surface portion of said silicon layer by using a dilute hydrochloric acid (HCl) solution; and
    immersing said wafer into an ozone solution to form a chemical oxide layer on said silicon layer.

5. The method according to claim 1, wherein said silicon layer is annealed by a spike annealing rapid thermal process (RTP).

6. The method according to claim 5, wherein said spike annealing rapid thermal process (RTP) is executed by rapidly heating said silicon layer to a specific temperature and then instantaneously lowering said specific temperature to a room temperature.

7. The method according to claim 6, wherein said specific temperature is 1100° C.

8. A method of improving a resistance uniformity and repeatability of a wafer having a silicon layer thereon, comprising steps of:

treating said silicon layer with a low energy ion implantation;

removing a native oxide layer from said silicon layer;

forming a chemical oxide layer on said silicon layer; and annealing said silicon layer for recovering a damaged silicon crystal structure of said silicon layer resulted from said low energy ion implantation.

9. The method according to claim 8, wherein said native oxide layer is removed by using a dilute hydrofluoric acid (HF) solution.

10. The method according to claim 8, wherein said chemical oxide layer is formed by immersing said wafer into an ozone solution.

11. The method according to claim 9, wherein after said native oxide layer is removed, said method further includes a step of cleaning said silicon layer to remove a contaminant from said silicon layer by using a dilute hydrochloric acid (HCl) solution.

* * * * *